(12) United States Patent
Ebara

(10) Patent No.: US 6,858,885 B2
(45) Date of Patent: Feb. 22, 2005

(54) SEMICONDUCTOR APPARATUS AND PROTECTION CIRCUIT

(75) Inventor: Atsushi Ebara, Hyougo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/400,410

(22) Filed: Mar. 28, 2003

(65) Prior Publication Data

US 2003/0223164 A1 Dec. 4, 2003

(30) Foreign Application Priority Data

Mar. 28, 2002 (JP) ........................................ 2002-090231

(51) Int. Cl.$^7$ ........................ H01L 29/74; H01L 31/111

(52) U.S. Cl. ........................................ 257/173; 438/133

(58) Field of Search ........................... 257/173; 438/133

(56) References Cited

U.S. PATENT DOCUMENTS 6,130,117 A * 10/2000 Walker et al. .............. 438/133

* cited by examiner

Primary Examiner—David Nelms
Assistant Examiner—Tu-Tu Ho
(74) Attorney, Agent, or Firm—Dickstein Shapiro Morin & Oshinsky LLP

(57) ABSTRACT

A protection circuit for use in a semiconductor apparatus includes a first conductivity type semiconductor substrate, a second conductivity type first diffusion region formed on the semiconductor substrate, and a second conductivity type second diffusion region formed on the semiconductor substrate. The second diffusion region is distanced at a prescribed interval from the first diffusion region. The first diffusion region is electrically connected to a pad for electrically connecting the semiconductor apparatus to an outside region. The second diffusion region is electrically connected to a power supply voltage. At least a portion of each of the first and second diffusion regions is entirely formed right under a pad area having the pad.

26 Claims, 17 Drawing Sheets

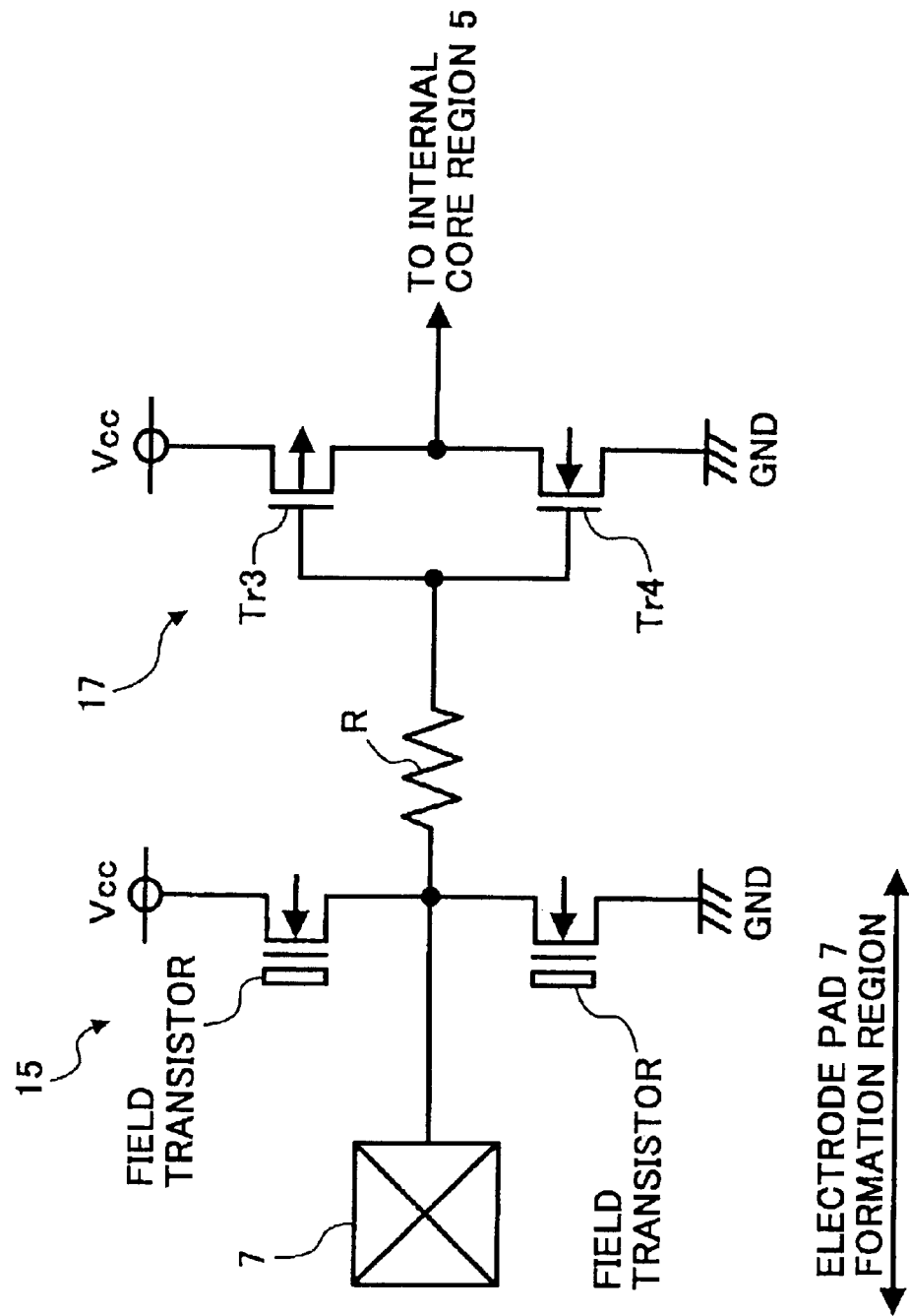

FIG. 13

| | SURGE IMPRESSED VOLTAGE | OBJECTIVE TRANSISTOR | ENERGY DIVERGENCE FACTOR |
|---|---|---|---|
| (1) | REGARDING Vcc + 2K | A | "ON" CURRENT |
| (2) | REGARDING Vcc − 2K | A | PUNCH THROUGH CURRENT |
| (3) | REGARDING GND + 2K | B | "ON" CURRENT |
| (4) | REGARDING GND − 2K | B | PUNCH THROUGH CURRENT |

SEMICONDUCTOR APPARATUS AND PROTECTION CIRCUIT

CROSS-REFERENCE TO RELATED APPLICATIONS

This application claims priority under 35 USC §119 to Japanese Patent Application No. 2002-090231 filed on Mar. 28, 2002, the entire contents of which are herein incorporated by reference.

FIELD OF THE INVENTION

This invention generally relates to a protection circuit for preventing destruction of an internal circuit possibly caused by excessive voltage input from a pad, and to a semiconductor apparatus employing the protection circuit.

BACKGROUND OF THE INVENTION

While there have been some attempts to protect internal circuits from destruction, these attempts have not been entirely successful.

FIGS. 10A and 10B entirely and partially illustrate GND (ground) and power supply pads mounted on a conventional semiconductor apparatus 46 formed from a P-type semiconductor substrate 3. As shown in FIG. 10A, an inner core region 5 is formed at a central portion of the semiconductor apparatus 46. An inner circuit formed from a plurality of semiconductor elements is located in the inner core region 5. A plurality of pad areas 7 is also formed in an outer region 15 of the semiconductor apparatus 46. An I/O cell 47 is provided per pad area 7 on the semiconductor substrate 3 between the inner core region 5 and pad area 7. There are provided an inner core region use Vcc line 11a and an inner core region use GND (ground) line 11b, each formed from a metal wiring layer, between the inner core region 5 and I/O cell 47. Lines 11a and 11b continuously circumscribe the inner core region 5. Further, to continuously extend over a plurality of I/O cells 47, an I/O cell use Vcc line 49a and an I/O cell use GND line 49b, each formed from a metal wiring layer, are provided.

As shown in FIG. 10B, the inner core region use Vcc line 11a and I/O cell use Vcc line 49a are electrically connected to a metal wiring layer 51a which is electrically connected to an electric power supply use pad area 7a through via holes 11c and 49c. The inner core region use GND line 11b and I/O cell use GND line 49b are electrically connected to the metal wiring layer 51b which is electrically connected to a GND use pad area 7b through via holes 11d and 49d. The inner core region use Vcc line 11a is electrically connected to a metal wiring layer 53a extending over in the side of inner core region 5 through a via hole 11e. The inner core region use GND line 11b is electrically connected to a metal wiring layer 53b extending over to the side of inner core region 5 through a via hole 11f.

FIG. 11 illustrates an exemplary configuration of a conventional pad area 7 and I/O cell 47. FIG. 12 illustrates an equivalent circuit thereof. Each I/O cell 47 is configured from a protection circuit and input buffer 17. The protection circuit is configured from a P-channel type MOSFET (Metal Oxide Silicon Field Effect Transistor) Tr5 (herein after referred to as a MOS transistor Tr5), a N-channel type MOS transistor Tr6, and a resister R (not shown).

As shown in FIG. 11, the MOSFET transistor Tr5 is formed in a P channel region of a N-well formed on the P-type semiconductor substrate. A gate electrode is configured from a polysilicon electrode 55. An area required for forming the MOS transistor Tr5 is approximately 1800 $\mu$m. The MOS transistor Tr6 is formed in an N-channel region of a P-type semiconductor substrate. Both source and drain of the MOS transistor Tr6 are configured from a N-type impurity diffusion layer (N-type impurity) formed on the P-type semiconductor substrate. A gate electrode is configured from a polysilicon electrode 57. An area required for forming the MOS transistor Tr6 is approximately 1000 $\mu$m.

As depicted in FIG. 12, both the poly-silicon gate electrode 55 and a source of the MOS transistor Tr5 are connected to power supply "Vcc". Respective drains of the MOS transistors Tr5 and Tr6 are connected to each other, and further connected to the pad area 7. Both the polysilicon gate electrode 57 and source of the MOS transistor Tr6 are connected to ground "GND". One end of the resistance is connected to a connection point connecting drains of the MOS transistors Tr5 and Tr6.

As further shown in FIGS. 11 and 12, the input buffer 17 is configured from an inverter circuit formed from P-channel type and N-channel type MOS transistors Tr3 and Tr4. The MOS transistor Tr3 is formed in the P-channel region of the N-well formed on the P-type semiconductor substrate. Both the source and drain of the MOS transistor Tr3 are configured from P-type impurity diffusion layers formed in the N-well. A gate electrode is configured from a polysilicon electrode 59. The MOS transistor Tr4 is formed in an N-channel region of the P-type semiconductor substrate. Both the source and drain of the MOS transistor Tr4 are configured from N-type impurity diffusion layers (N-type impurity) formed on a P-type semiconductor substrate. A gate electrode is configured from a polysilicon electrode 61, as shown in FIG. 11.

As depicted in FIG. 12, the source of the MOS transistor Tr3 is connected to the power supply "Vcc". The source of the MOS transistor Tr4 is connected to ground (GND). Respective drains of the MOS transistors Tr3 and Tr4 are connected to each other, and are lead to the inner core region 5. Respective polysilicon gates 59 and 61 of the MOS transistors Tr3 and Tr4 are connected to each other, and further connected to the other end of the resistance.

As illustrated in FIGS. 10 to 12, none of the circuits are conventionally formed on the pad area 7 of the semiconductor substrate 3. That is, punching through phenomenon occurs in a metal wiring layer forming the pad area 7 when wire-bonding is performed with a bonding wire so as to electrically connect the pad area 7 to an external terminal during an assembling process for the semiconductor apparatus. As a countermeasure, a well or the like is formed in the range of the pad area 7 on the semiconductor substrate 3.

Further, based upon recent miniaturization, downsizing (i.e., shrinkage) is promoted in order to decrease cost for a semiconductor product. For the purpose of avoiding destruction of an internal circuit caused by a voltage excessively input from a pad, a protection circuit for an I/O cell is typically provided.

However, since a withstand pressure of a MOS transistor simply decreases in accordance with the miniaturization, and an area occupied by the protection circuit cannot be minimized, the protection circuit prevents the shrinkage.

Further, in accordance with the miniaturization, the inner core region is downsized, and accordingly, the I/O cell increases a rate of its occupation in a semiconductor apparatus. Thus, when shrinkage is promoted, there are pressing needs to minimize the area occupied by the I/O cell in the semiconductor apparatus. Further, as illustrated in FIG. 11, a rate of an area for a pad area 7 is high.

However, since multiple layers, formed from interlaminar insulation layers and metal wiring layers, are formed between a surface of a pad and a semiconductor substrate by a recent multiple layer technology of metal wiring layers, damage to the semiconductor substrate, caused by the wire bonding in the pad area, does not prominently occur in comparison with that in the past. In addition, even formation of a well is needless nowadays. Despite that, semiconductor apparatus used in the past generally are configured to form none of the semiconductor elements within a pad area.

As a conventional technology that efficiently utilizes a pad area, Japanese patent application Laid Open No. 2000-12778 discloses one example. Specifically, a protection circuit is formed on an N-type semiconductor substrate, having an NPN configuration. The protection circuit is formed from an N-implant diffusion layer, a P-type island region including a P-implant layer and P-diffusion layer, and a N-diffusion layer formed on the island region.

However, when the protection circuit, disclosed in Japanese patent application Laid Open No. 2000-12778, is formed, both N and P-type implant layers are necessitated. As a result, a problem of increasing a number of manufacturing processes occurs when such a manner is applied to a semiconductor apparatus excluding an implant layer.

BRIEF SUMMARY OF THE INVENTION

Accordingly, an object of the present invention is to address such problems and provide a new protection circuit for use in a semiconductor apparatus. The protection circuit includes a first conductivity type semiconductor substrate, a second conductivity type first diffusion region formed on the semiconductor substrate, and a second conductivity type second diffusion region formed on the semiconductor substrate. The second diffusion region is distanced at a prescribed interval from the first diffusion region, and the first diffusion region is electrically connected to a pad for electrically connecting the inner circuit to an outside region. The second diffusion region is electrically connected to a power supply. At least a portion of said first and second diffusion regions is formed right under a pad area.

In another embodiment, the first and second diffusion regions are substantially entirely formed right under the pad area.

In another embodiment, the first and second diffusion regions are separated from each other by a field oxide coat formed on the surface of the semiconductor substrate. At least a portion of the field oxide coat is located right under the pad area.

In yet another embodiment, a second conductivity type third diffusion region is formed on the surface of the semiconductor substrate and located in an opposite side at a prescribed interval from the first diffusion region to the second diffusion region. The second diffusion region is electrically connected to a higher voltage of the power supply. The third diffusion region is electrically connected to a lower voltage of the power supply. At least a portion of the third diffusion region is formed right under the pad area.

In still another embodiment, the third diffusion region is substantially entirely formed right under the pad area.

In yet another embodiment, the first and second diffusion regions, and the first and third diffusion regions are separated, respectively, from each other by a field oxide coat. At least a portion of the pad area is formed on the field oxide coat.

In yet another embodiment, the electrical connection is performed by at least one via hole formed right under the pad area.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 9 is a chart illustrating another example of an equivalent circuit of an I/O cell;

FIG. 13 is a chart showing an example of a table showing surge impressed voltages and conditions of energy divergence factors.

DETAILED DESCRIPTION OF THE INVENTION

Figure 1A:
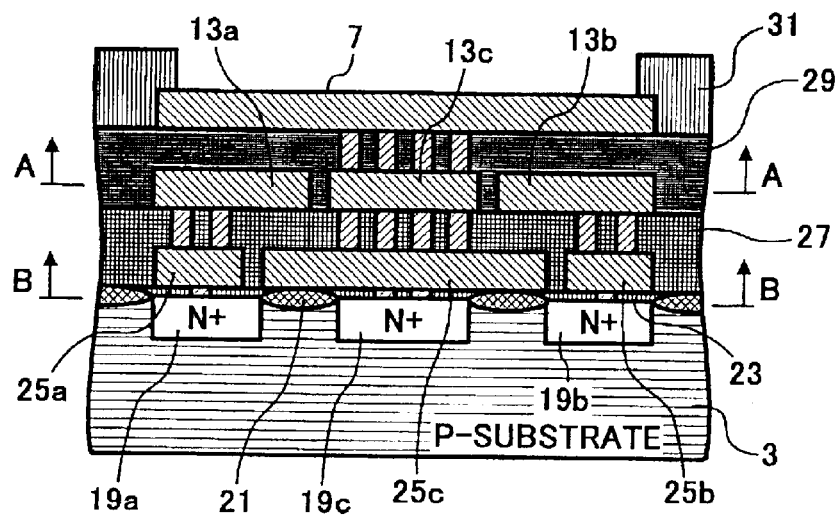
FIG. 1A is a chart when viewed from a section C—C illustrated in FIGS. 1B and 1C.
Figure 1B:
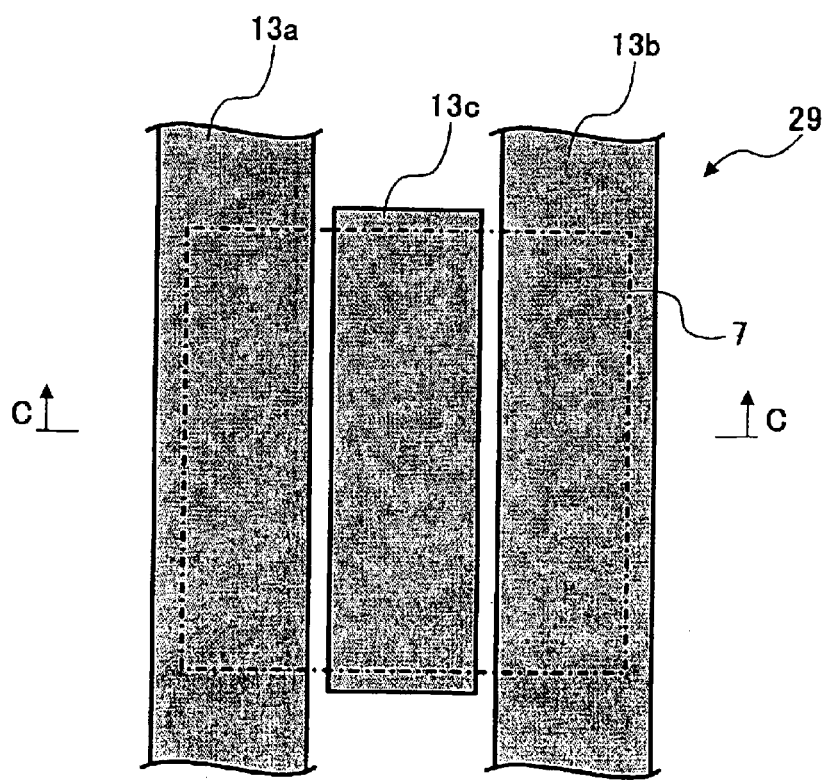
FIG. 1B is a chart when viewed from a section A—A illustrated in FIG. 1A.

Referring now to the drawings, wherein like reference numerals designate identical or corresponding parts throughout several views, in particular, in FIGS. 1A, 1B, 2A and 2B, one embodiment of an outer region of a protection circuit of a semiconductor apparatus is illustrated.

Figure 2A:
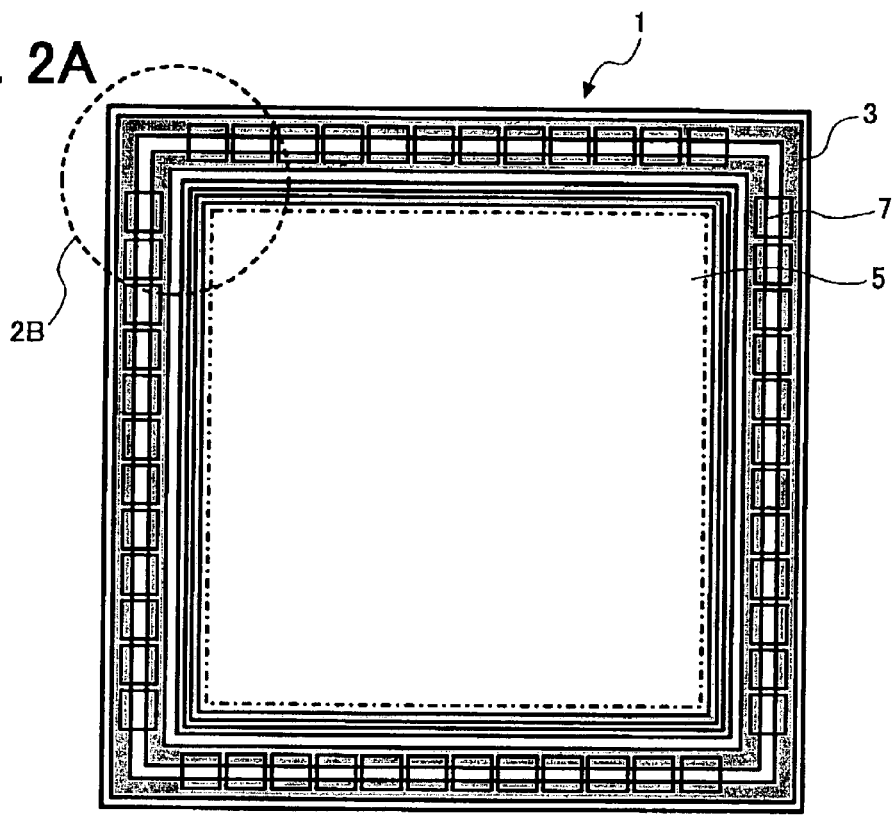
FIG. 2A is a plan view illustrating one embodiment.
Figure 2B:
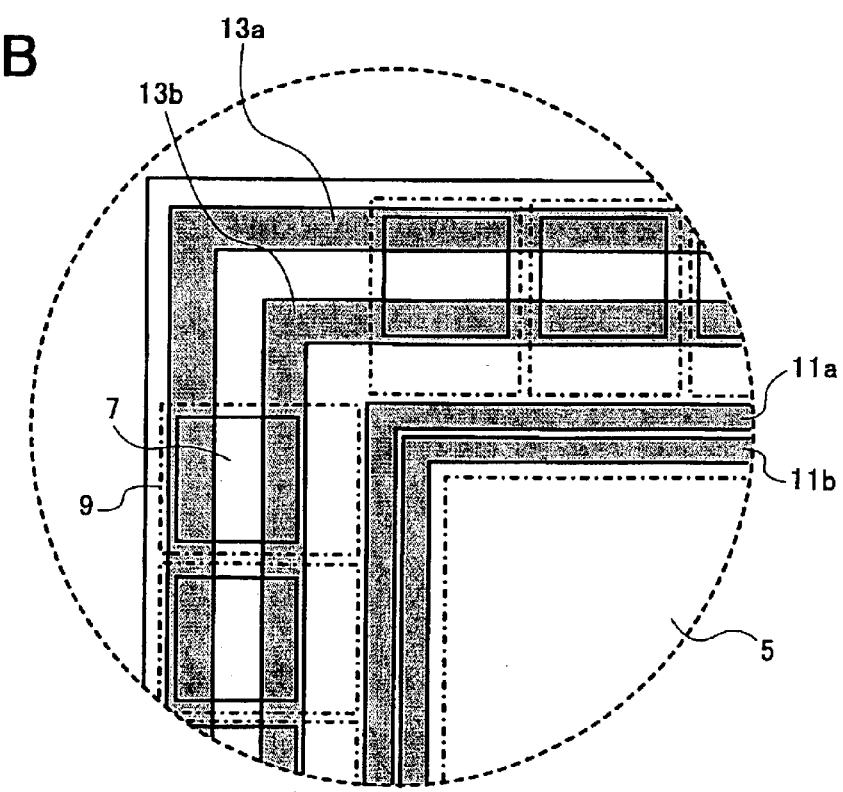
FIG. 2B is an enlarged view illustrating a portion framed by a circle (dotted circle) in FIG. 2A.

As depicted in FIG. 2A, an inner core region 5 is formed at a central section of a semiconductor apparatus 1 formed from a P-type semiconductor substrate 3. An inner circuit formed from a plurality of semiconductor elements is formed in the inner core region 5. A plurality of pads is also formed in an outer region of the semiconductor apparatus 1. Referring to FIG. 2B, an I/O cell 9 is arranged per a pad area 7 on the semiconductor substrate 3, including a range for forming the pad area 7. An inner core region use Vcc line 11a and an inner core region use GND line 11b, each formed from a metal wiring layer, are continuously formed between the inner core region 5 and I/O cell 9 almost surrounding the inner core region 5. An I/O cell use Vcc line 13a and an I/O cell use GND line 13b, each formed from a metal wiring layer, are continuously formed, extending over regions for forming a plurality of pads. Such a Vcc represents a high potential of a power supply. The GND represents a lower potential of the power supply.

The inner core region use Vcc line 11a and I/O cell use Vcc line 13a are configured by metal wirings arranged on a layer lower than the pad area 7. The inner core region use Vcc line 11a and I/O cell use Vcc line 13a are electrically connected to a power supply use pad area 7 via a metal wiring layer (not shown) formed on a layer where the pad area 7 is formed. The inner core region use GND line 11b and I/O cell use GND line 13b are configured by metal wirings arranged on a layer lower than the pad area 7. The inner core region use GND line 11b and I/O cell use GND line 13b are electrically connected to a GND use pad area 7 via the metal wiring layer (not shown) formed on the layer where the pad area 7 is formed.

Figure 3:
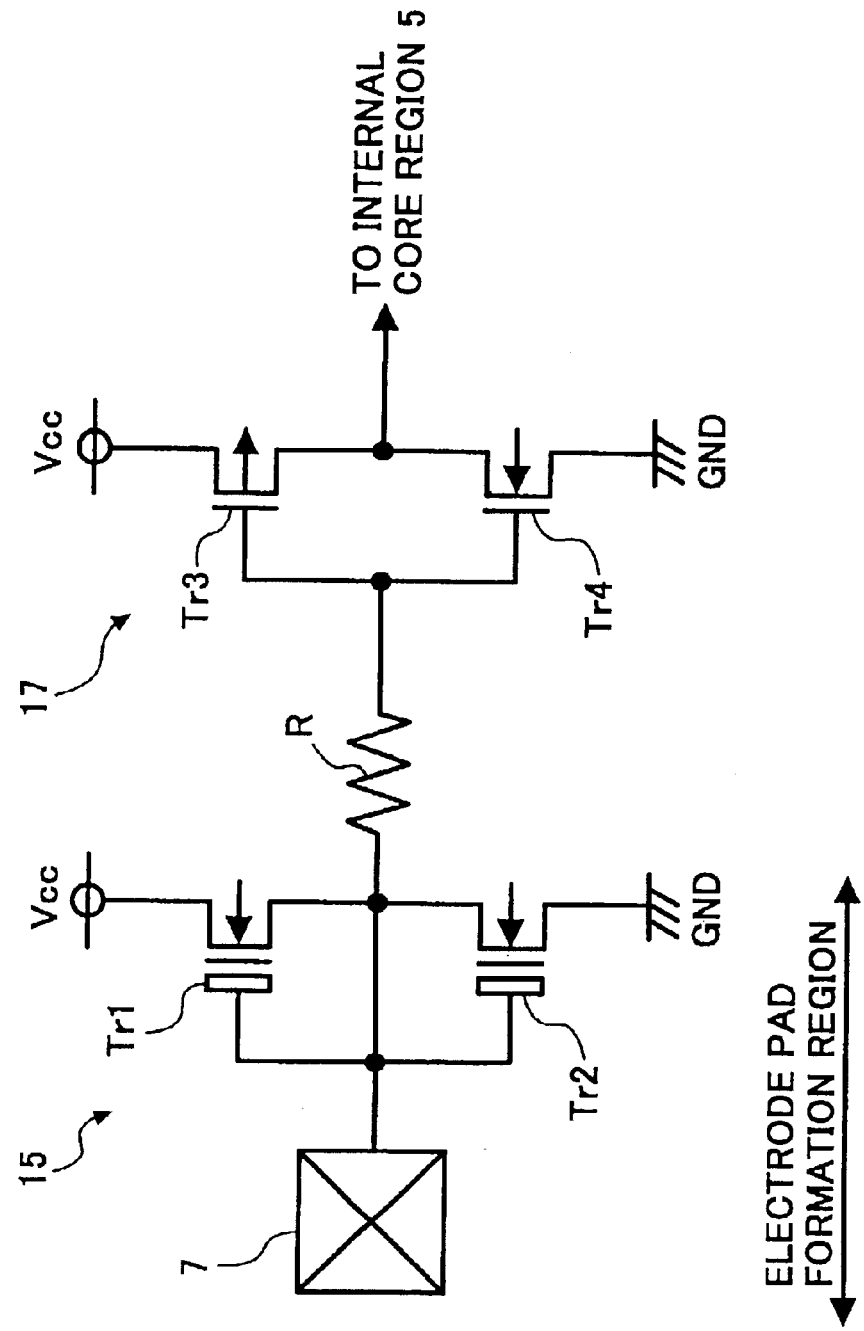
FIG. 3 is a chart illustrating one example of an equivalent circuit of a pad area 7 and I/O cell 9.

FIG. 3 illustrates one example of an equivalent circuit of a pad area 7 and I/O cell 9. A protection circuit 15 and an input buffer 17 configure each I/O cell 9. The protection circuit 15 is configured from an N-channel type field transistor Tr1, a N-channel type field transistor Tr2, and a resistance R formed from a diffusion layer. Even though the diffusion layer configures the resistance R, a resistance formed from a poly-silicon coat and a metal lamina can be utilized therefor.

As illustrated in FIG. 3, the drain of the N-channel type field transistor Tr1 is connected to the power supply Vcc. The source and drain of the field transistors Tr1 and Tr2, respectively, are connected to each other, and then connected to the pad area 7. The gate electrodes of the field transistors Tr1 and Tr2 are connected to each other, and then connected to the pad area 7. One end of the resistance R is connected to a connection point connecting the source of the field transistor Tr1 to the drain of the field transistor Tr2.

As further shown in FIG. 3, an inverter circuit formed from P-channel type and N-channel type MOS transistors Tr3 and Tr4 configures the input buffer 17. The source of the MOS transistor Tr3 is connected to the power source Vcc. The source of the MOS transistor Tr4 is connected to GND. The drains of the MOS transistors Tr3 and Tr4, respectively, are connected to each other, and then lead to the inner core region 5. The gate electrodes of the MOS transistors Tr3 and Tr4, respectively, are connected to each other, and then connected to the other end of the resistance R.

Although illustrations of the diffusion type resistance R and MOS transistors Tr3 and Tr4 are omitted, the diffusion type resistance R is formed on a P-type semiconductor substrate 3 between the pad area 7 in an I/O cell 9 formation region and the inner core region use Vcc line 11a.

Referring to FIG. 1A, a configuration of the protection circuit 15 is described other than the resistance R. Plural N-type impurity diffusion regions 19a, 19b, and 19c are formed on a surface of a P-type semiconductor substrate (P-substrate). An oxide film 21 separates these N-type impurity diffusion regions 19a, 19b, and 19c from each other. The N-type impurity diffusion region 19a is distanced from the N-type impurity diffusion region 19c. The N-type impurity diffusion region 19b is formed in an opposite side and distanced from the N-type impurity diffusion region 19c and the N-type impurity diffusion region 19a. The N-type impurity diffusion region 19a constitutes a second diffusion range forming the protection circuit of the semiconductor apparatus. The N-type impurity diffusion region 19b serves as a third diffusion region. The N-type impurity diffusion region 19c serves as a first diffusion region.

The N-type impurity diffusion region 19a corresponds to the drain of the field transistor Tr1 of FIG. 3. The N-type impurity diffusion region 19b corresponds to the source of the field transistor Tr2 of FIG. 3. The N-type impurity diffusion region 19c corresponds to the source of the field transistor Tr1 and the drain of the field transistor Tr2 of FIG. 3.

An insulation coat 23 is formed on the surfaces of the N-type impurity diffusion regions 19a, 19b and 19c. The lowest metal wiring layers 25a, 25b, and 25c are separately formed from each other on field oxide coat 21 and insulation coat 23. The lowest metal wiring layer 25a is also electrically connected to the N-type impurity diffusion region 19a through a via hole formed through the insulation coat 23. The lowest metal wiring layer 25b is electrically connected to the N-type impurity diffusion region 19b through a via hole formed through the insulation coat 23. The lowest metal wiring layer 25c is electrically connected to the N-type impurity diffusion region 19c through a via hole formed in the insulation coat 23. The lowest metal wiring layer 25c is formed on the field oxide coat 21 extending over from a portion between the N-type impurity diffusion regions 19a and 19c to that between the N-type impurity diffusion regions 19b and 19c. The metal wiring layer 25c corresponds to the gate electrodes of the field transistors Tr1 and Tr2 of FIG. 3.

An interlaminar insulation layer 27 is formed on the field oxide coat 21, insulation coat 23, and lowest metal wiring layers 25a, 25b, and 25c. Further, an I/O cell use Vcc line 13a, an I/O cell use GND line 13b, and a metal wiring layer 13c each formed from a metal wiring layer are formed on the layers. The I/O cell use Vcc line 13a, and I/O cell use GND line 13b are continuously formed extending over a region, where a plurality of pads are formed thereabove, as illustrated in FIG. 2B.

As shown in FIG. 1A, there are provided via holes through the inter-laminar insulation layer 27 for electrically connecting the lowest metal wiring layers 25a, 25b, and 25c to I/O cell use Vcc lines 13a, 13b, and 13c, the lowest metal wiring layer 25b to I/O cell use GND line 13b, and the lowest metal wiring layer 25c to metal wiring layer 13c, respectively.

Also illustrated in FIG. 1A, an inter-laminar insulation layer 29 is formed on the inter-laminar insulation layer 27, I/O cell use Vcc line 13a, I/O cell use GND line 13b, and metal wiring layer 13c. Further, a pad area 7, formed from a metal wiring layer, is formed on the layers. A passivation coat 31 is formed on the inter-laminar insulation layer 29 and pad area 7. There is formed a pad opening section on a pad area 7 of the passivation coat 31. A plurality of via holes are formed so as to electrically connect the metal wiring layer 13c to the pad area 7.

Figure 4A:
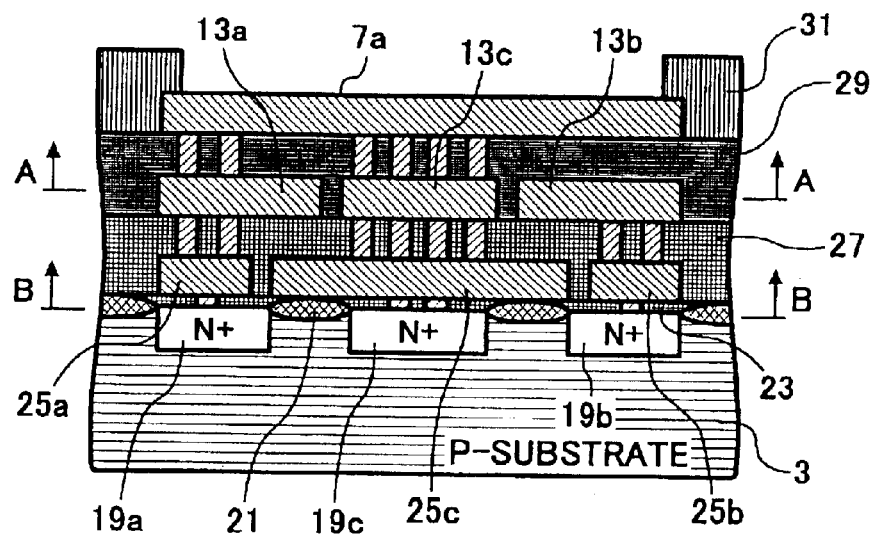
FIG. 4A is a cross-sectional view illustrating one example of an outer region of a Vcc use pad.

As illustrated in FIG. 4A, any one of pads 7 on the semiconductor apparatus 1 is utilized as a Vcc use pad area 7a. A plurality of via holes are formed through the inter-laminar insulation coat 29 right under a Vcc use pad area 7a so as to electrically connect the Vcc use pad area 7a to the I/O cell use Vcc line 13a.

Figure 4B:
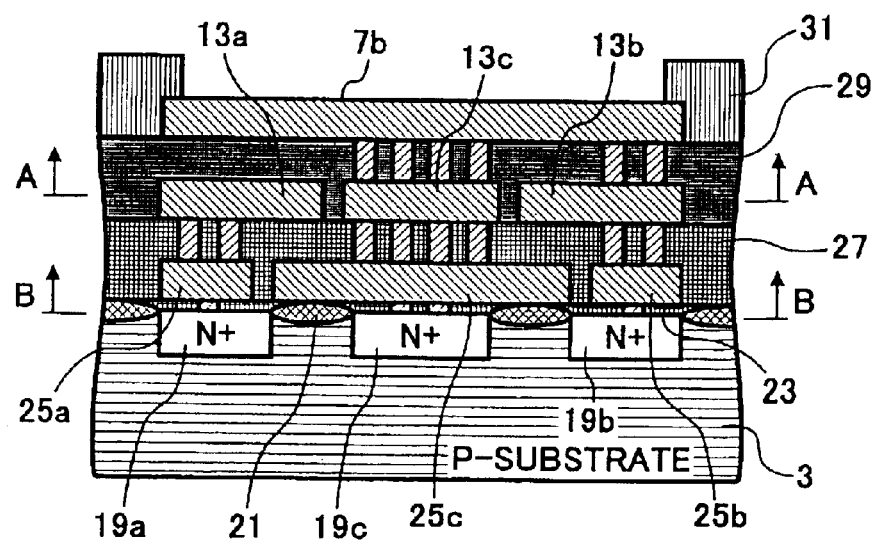
FIG. 4B is a cross-sectional view illustrating one example of an outer region of a GND use pad.

Further, as shown in FIG. 4B, any one of pads 7 on the semiconductor apparatus 1 beside the Vcc use pad area 7a, is utilized as a GND use pad area 7b. A plurality of via holes are formed through the inter-laminar insulation coat 29 right under a GND use pad area 7b so as to electrically connect the GND use pad area 7b to the I/O cell use GND line 13b.

One example of an operation of the protection circuit 15 is now described with reference to FIGS. 3 and 13.

As listed in Table 1 of FIG. 13, a surge-impressed voltage represents a voltage excessively impressed to a pad area 7. In general, a surge test is executed by a method, called HBM (Human Body Model), and various impressed voltages shown in the Table 1 are utilized.

When +2 kv (kilo volt) is impressed to the pad area 7 relative to the power supply Vcc, the field transistor Tr1 is turned ON. Then, such a surge-impressed voltage is decreased to the power supply Vcc level due to discharge, i.e., an ON current. When –2 kv is impressed to the pad area 7 relative to the power supply Vcc, a punch through current flows through the field transistor Tr1, and the surge-impressed voltage is increased to the power supply Vcc (as shown in column (1) of Table 1).

When +2 kv is impressed to the pad area 7 relative to the GND, the field transistor Tr2 is turned ON, and the surge impressed voltage is decreased to a GND level due to discharge, i.e., an ON current (shown in column (3) of Table 1). When –2 kv is impressed to the pad area 7 relative to GND, a punch through current flows through the field transistor Tr2, and the surge impressed voltage increases to the GND level (as shown in column (2) of Table 1). In this way, even if an input voltage is excessively impressed to the pad area 7, both MOS transistors Tr3 and Tr4, forming an input buffer 17, can be protected.

Thus, since the field transistors Tr1 and Tr2 collectively constituting the protection circuit 15 are formed right under the pad area 7, an area for a semiconductor apparatus 1 can be downsized. Further, since the I/O cell use Vcc line 13a and an I/O cell use GND line 13b are also formed right under the pad area 7, an area for a semiconductor apparatus 1 can be downsized.

Further, since damage to the pad area 7 by wire bonding during an assembling process is not completely negligible, a change in property caused by the damage is also not negligible when a semiconductor element is arranged right under the pad area. Accordingly, a semiconductor element designed by simulating based upon a basic property cannot be arranged there. However, since the protection circuit is not generally simulated and is enough if functional, delicate designing is not generally required. Accordingly, the field transistors Tr1 and Tr2 forming the protection circuit 15 raise no problem even if formed right under the pad area 7.

As described heretofore, this embodiment employs the three layer metal wiring structure as illustrated in FIG. 1A. However, one, two, and more than four layer metal wiring structures can be employed in a semiconductor apparatus. In addition, when the one layer metal wiring structure is employed, both the power supply and GND lines are formed other than the range for the pad.

When a design rule is about a half micron, the three layer metal wiring shown in FIG. 1A has been prevailing. A thickness of each of the lowest metal layer wiring layers 25a, 25b and 25c, I/O cell use Vcc line 13a, I/O cell use GND line 13b, metal wiring layer 13c, and pad area 7 amount to almost 700 nm (nanometer), and that of the interlaminar insulation layers 27 and 29 almost 800 nm, respectively. Accordingly, a coat thickness from the surface of the field oxide film to that of the pad area 7 amounts to about 3700 nm in the three metal wiring structures.

Further, the design rule includes dimensions that are quarter or sub-quarter micron. The six-layer metal wiring structure that employs such a design rule may be employed in the semiconductor apparatus.

Figure 5:
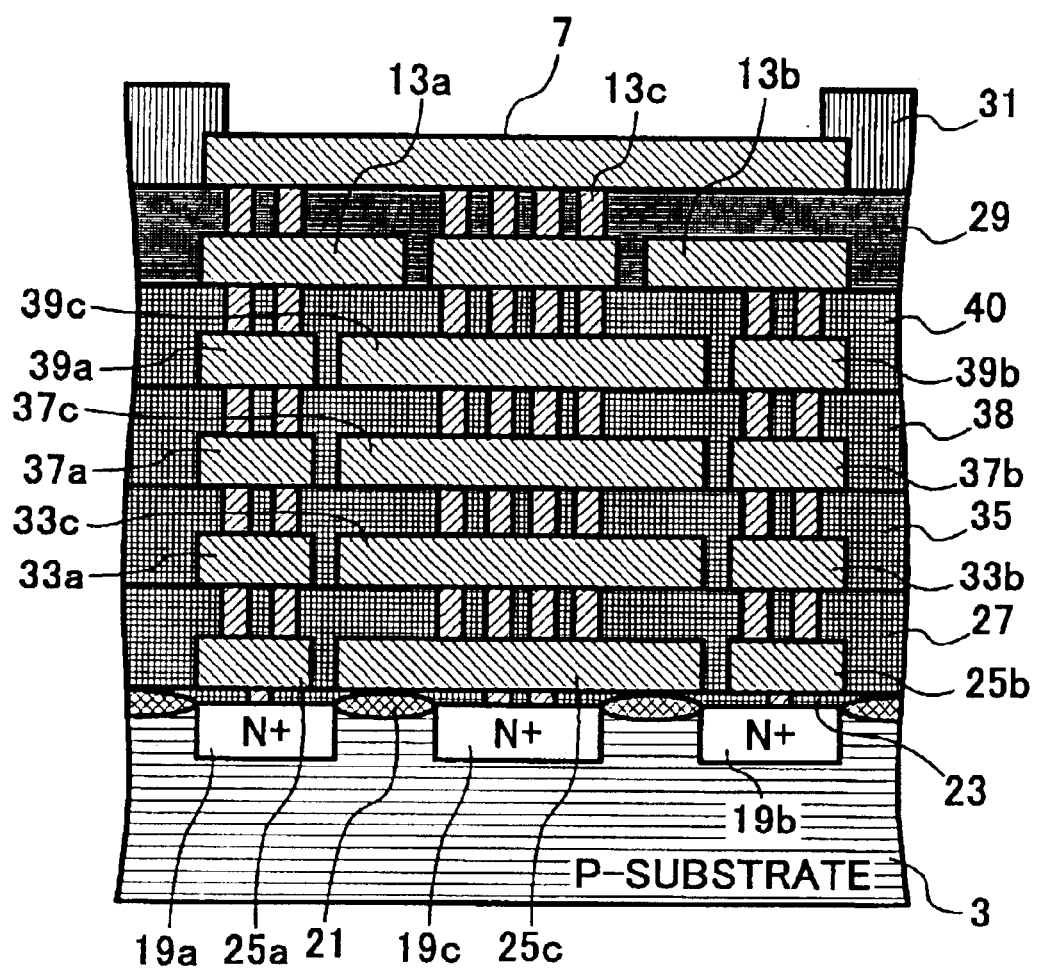
FIG. 5 is a cross-sectional view illustrating an exemplary protection circuit applied to a six-layer metal wiring structure.

FIG. 5 is a cross-sectional view illustrating an exemplary protection circuit employing the six layer metal wiring structure. By assigning the same numeric legends to sections functioning in a manner similar to those in FIG. 1, detailed descriptions are omitted. The N-type impurity diffusion regions 19a, 19b and 19c are separated by a field oxide film 2 and formed on the surface of the P-type semiconductor substrate 3. An insulation coat 23 is formed on surfaces of the N-type impurity diffusion regions 19a, 19b and 19c. A plurality of lowest metal wiring layers 25a, 25b and 25c are separated from each other and formed on the field oxide film and insulation coat 23. The lowest metal wiring layers 25a, 25B, 25c and N-type impurity diffusion regions 19a, 19b and 19c, are electrically connected to each other, respectively, through via holes formed through the insulation coat 23.

The interlaminar insulation layers 27 are formed on the field oxide film 21, insulation coat 23, and lowest metal wiring layers 25a, 25b and 25c. Further, the second metal wiring layers 33a, 33b and 33c each separated from each other, interlaminar insulation layer 35, the third metal wiring layers 37a, 37b and 37c each separated from each other, interlaminar insulation layer 38, and the fourth metal wiring layers 39a, 39b and 39c each separated from each other, are laminated in this order on the interlaminar insulation layers 27. There are formed a plurality of via holes at prescribed locations on the respective interlaminar insulation layers 27, 35 and 38. The lowest metal wiring layer 25a, second metal wiring layer 33a, third metal wiring layer 37a, and fourth metal wiring layer 39a are electrically connected to each other. In addition, the lowest metal wiring layer 25b, second metal wiring layer 33b, third metal wiring layer 37b, and fourth metal wiring layer 39b are electrically connected to each other. The lowest metal wiring layer 25c, second metal wiring layer 33c, third metal wiring layer 37c, and fourth metal wiring layer 39c are also electrically connected to each other.

As illustrated in FIG. 5, the interlaminar insulation layer 40 is formed on the interlaminar insulation layer 38 and fourth metal wiring layers 39a, 39b and 39c. Further, the I/O cell use Vcc line 13a, I/O cell use GND line 13b, each formed from a fifth metal wiring layer, and metal wiring layer 13c are formed on the interlaminar insulation layer 40. The I/O cell use Vcc line 13a and I/O cell use GND line 13b are continuously formed extending over a plurality of pads 7 in a similar manner as shown in the embodiment of FIG. 2B. Referring again to FIG. 5, the interlaminar insulation layer 29 is formed on the interlaminar insulation layer 40 and I/O cell use Vcc line 13a, I/O cell use GND line 13b and metal wiring layer 13c. A pad area 7 formed from a top metal wiring layer is formed on the interlaminar insulation layer 29. A passivation coat 31 is formed on the interlaminar insulation layer 29 and pad area 7. The passivation coat 31 forms a pad opening on the pad.

A coat thickness of each of the lowest metal wiring layers 25a, 25b and 25c, second metal wiring layers 33a, 33b and 33c, third metal wiring layers 37a, 37b and 37c, fourth metal wiring layers 39a, 39b and 39c, I/O cell use Vcc line 13a, I/O cell use GND line 13b, metal wiring layer 13c, and pad area 7 amounts to about 700 nm. A coat thickness of each of the metal interlaminar insulation layers 27, 29, 35, 38 and 40 amounts to about 700 nm. Accordingly, the total coat thickness from the surface of the field oxide coat 21 to that of the pad area 7 amounts to about 7700 nm.

Thus, since the sixth metal wiring structure can increase a coat thickness in the range right under a pad area 7 in comparison with the three layer metal wiring structure, damage to a semiconductor substrate 3 during bonding can be minimized, and damage of a field transistor forming a protection circuit can substantially be decreased or sometimes prevented.

According to the above-described embodiment, the field transistor is utilized for the protection element. However, a MOS transistor having a poly-silicon gate can also be utilized as a protection element of the protection circuit.

Figure 1C:
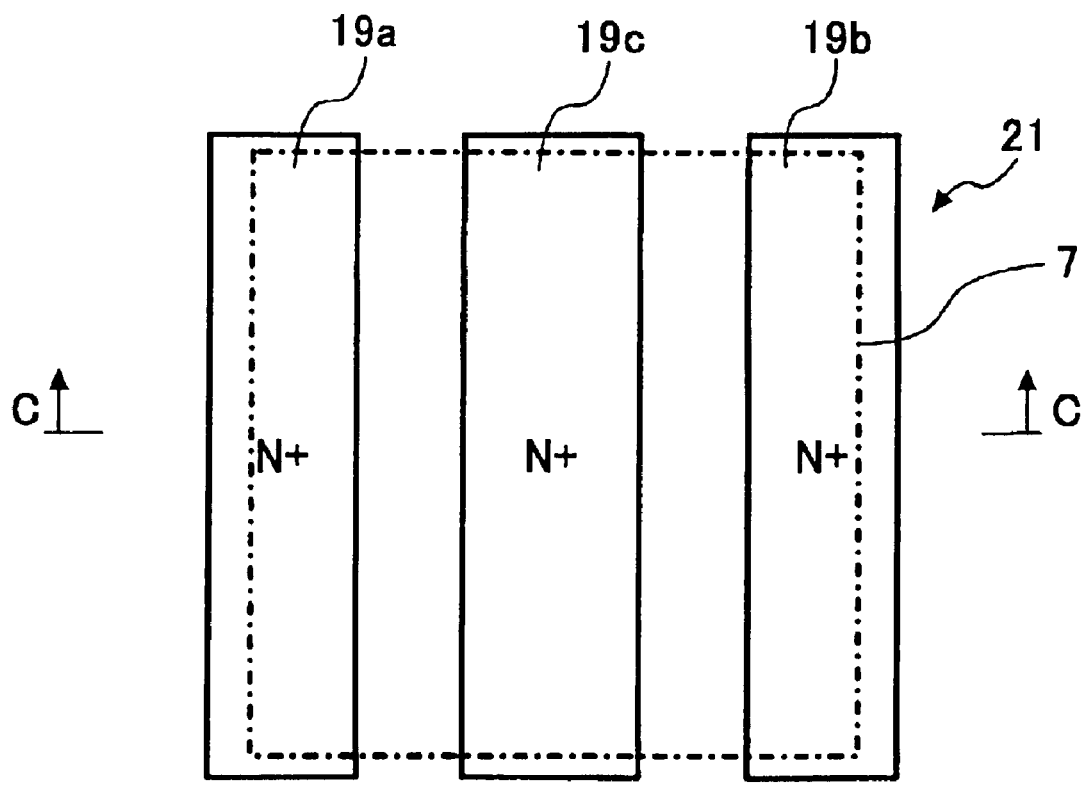
FIG. 1C is a chart when viewed from a section B—B illustrated in FIG. 1A.
Figure 6A:
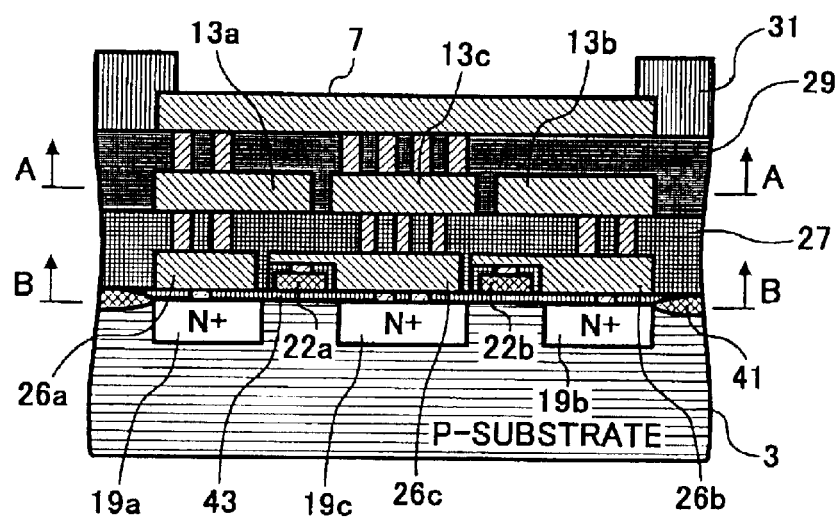
FIG. 6A is a cross-sectional view illustrating one example of an outer region of a protection circuit employing a MOS transistor having a poly-silicon gate as a protection element.
Figure 6B:
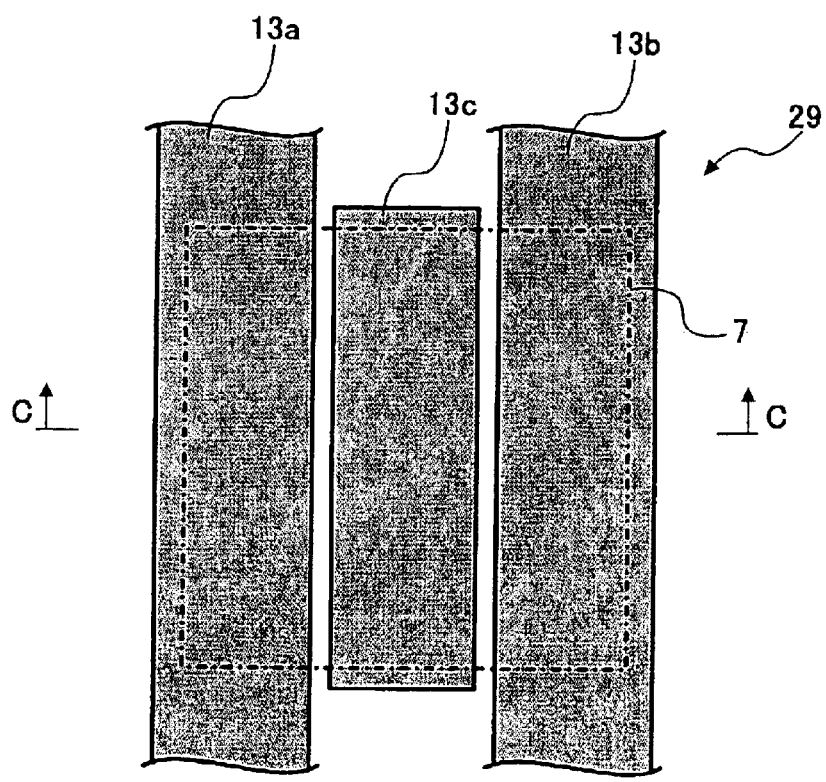
FIG. 6B is a chart when viewed from a section A—A of FIG. 6A.
Figure 6C:
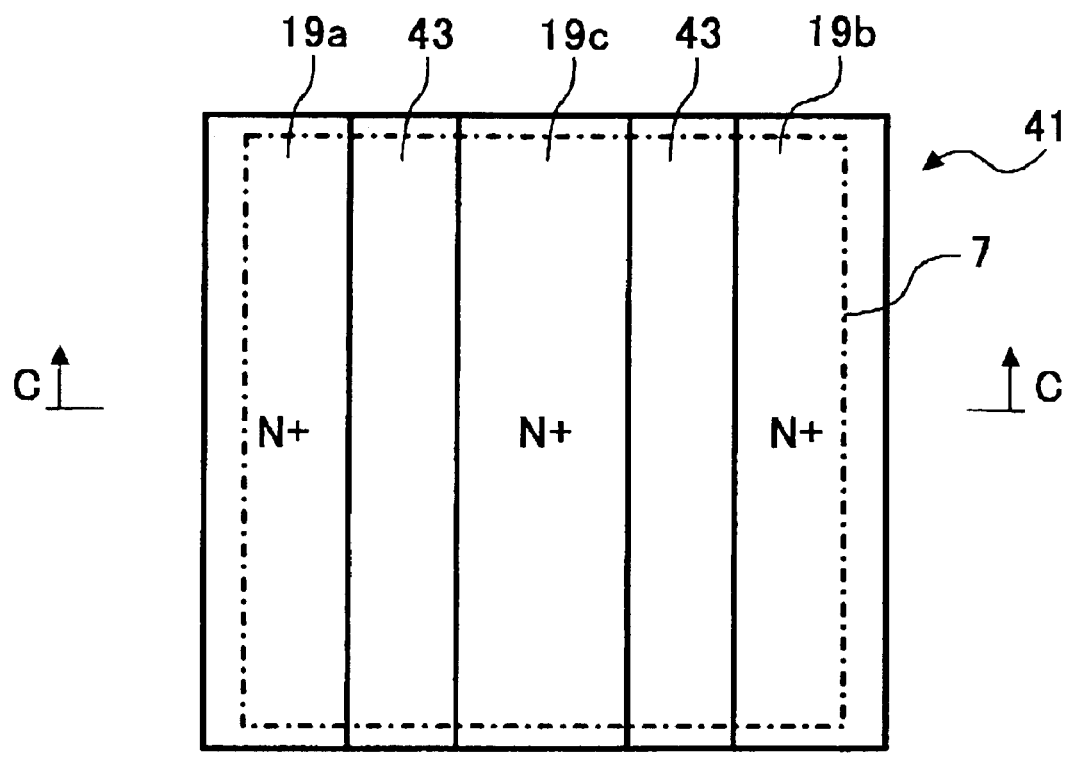
FIG. 6C is a chart when viewed from a section B—B of FIG. 6A.
Figure 7:
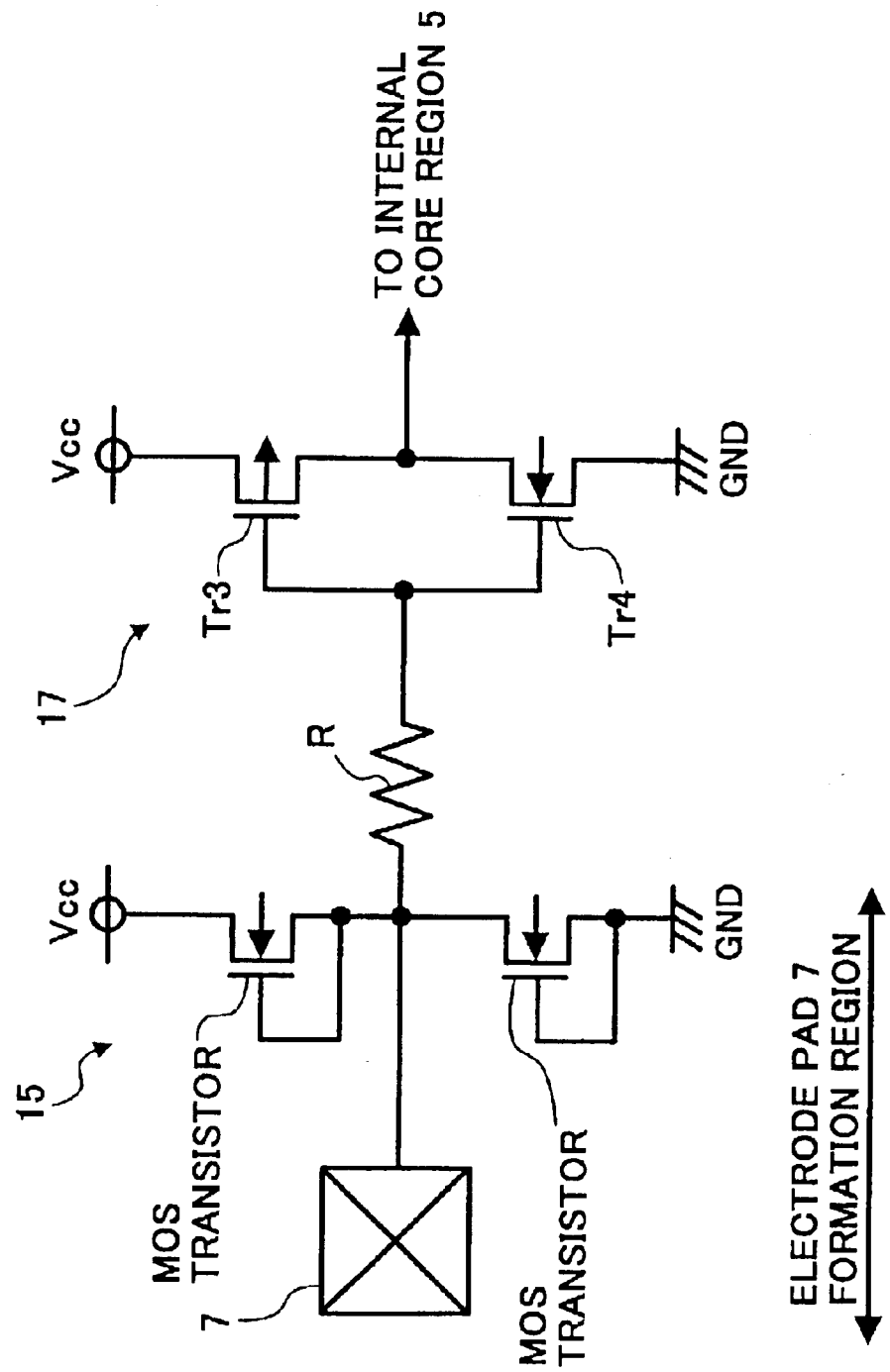
FIG. 7 is a chart illustrating one example of an equivalent circuit of a pad and I/O cell.

FIGS. 6A, 6B, and 6C illustrate one embodiment of a protection circuit employing a MOS transistor having a poly-silicon gate as a protection element of a protection circuit. The same numeric legends used in FIG. 1 are assigned to portions exerting the same functions in FIGS. 6A and 6B, so that detailed explanation can be omitted. One example of the embodiment of an I/O cell equivalent circuit is illustrated in FIG. 7. The plan view of this embodiment is substantially the same to that of FIG. 2.

Referring to FIG. 6A, the N-type impurity diffusion regions 19a, 19b and 19c are formed on the surface of the P-type semiconductor substrate 3 being surrounded by a field oxide film 41. The N-type impurity diffusion region 19a is separated from the N-TYPE IMPURITY diffusion region 19b. The N-type impurity diffusion region 19b is distanced and located on one side of the N-type impurity diffusion region 19c, opposite the side of the N-type impurity diffusion region 19a.

An insulation coat 43 is formed on the surface of the semiconductor substrate 3 and surfaces of the N-type impurity diffusion regions 19a, 19b and 19c, being surrounded by a field oxide coat 41. A poly-silicon gate 22a is formed on the insulation coat 43 between the N-type impurity diffusion regions 19a and 19b. A poly-silicon gate 22b is also formed on the insulation coat 43 between N-type impurity diffusion regions 19b and 19c. Another insulation coat is formed on the poly-silicon gates 22a and 22b.

The lowest metal wiring layers 26a, 26b and 26c are formed, being separated from each other, on the insulation coat 43 and poly-silicon gates 22a and 22b. The lowest metal wiring layer 26b is formed extending from the poly-silicon gates 22b to the N-type impurity diffusion region 19b. The lowest metal wiring layer 26c is formed extending from the poly-silicon gate 22a to the N-type impurity diffusion region 19c.

The lowest metal wiring layer 26a is electrically connected to the N-type impurity diffusion region 19a through a via hole formed through the insulation coat 43. The lowest metal wiring layer 26b is electrically connected to the N-type impurity diffusion region 19b and poly-silicon gate 22b through via holes formed in the insulation coat 43. In addition, the lowest metal wiring layer 26c is electrically connected to the N-type impurity diffusion region 19c and poly-silicon gate 22a through via holes formed in the insulation coat 43.

An interlaminar insulation layer 27 is formed on the field oxide coat 41, insulation coat 43, poly-silicon gates 22a and 22b, and lowest metal wiring layers 26a, 26b, and 26c. Further, the I/O cell use Vcc line 13a, I/O cell use GND line 13b, and metal wiring layer 13c are formed on the interlaminar insulation layers. The I/O cell use Vcc line 13a and I/O cell use GND line 13b are continuously formed extending over a plurality of regions for forming pads 7 as illustrated in FIG. 2B. Referring to FIG. 6A, the interlaminar insulation layer 29 is formed on the interlaminar insulation layer 27, I/O cell use Vcc line 13a, I/O cell use GND line 13b and metal wiring layer 13c. The lowest metal wiring layers 26a, 26b, and 26c are separately formed from each other on the field oxide coat 41 and insulation coat 43. Further, the pad area 7 and passivation coat 31 are formed right above the lowest metal wiring layers 26a, 26b, and 26c.

When excessively impressed to the pad area 7, an input voltage is discharged toward the power supply Vcc or GND by an ON current or punch through current caused by a MOS transistor, which is formed either from the N-type impurity diffusion regions 19a and 19c and poly-silicon gate 22a or that formed from the N-type impurity diffusion regions 19b and 19c and poly-silicon gate 22b.

Figure 8A:
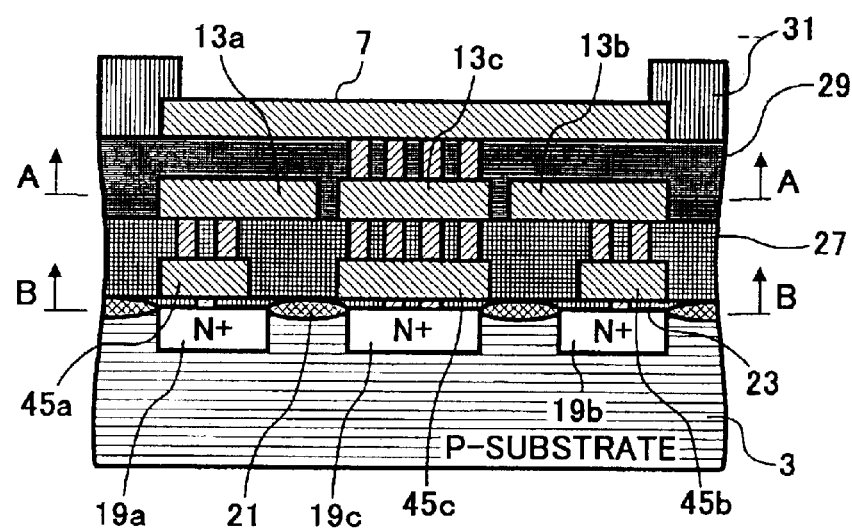
FIG. 8A is a chart illustrating another embodiment of a protection circuit employing a field transistor as a protection element, when viewed from a section C—C of FIGS. 8B and 8C.
Figure 8B:
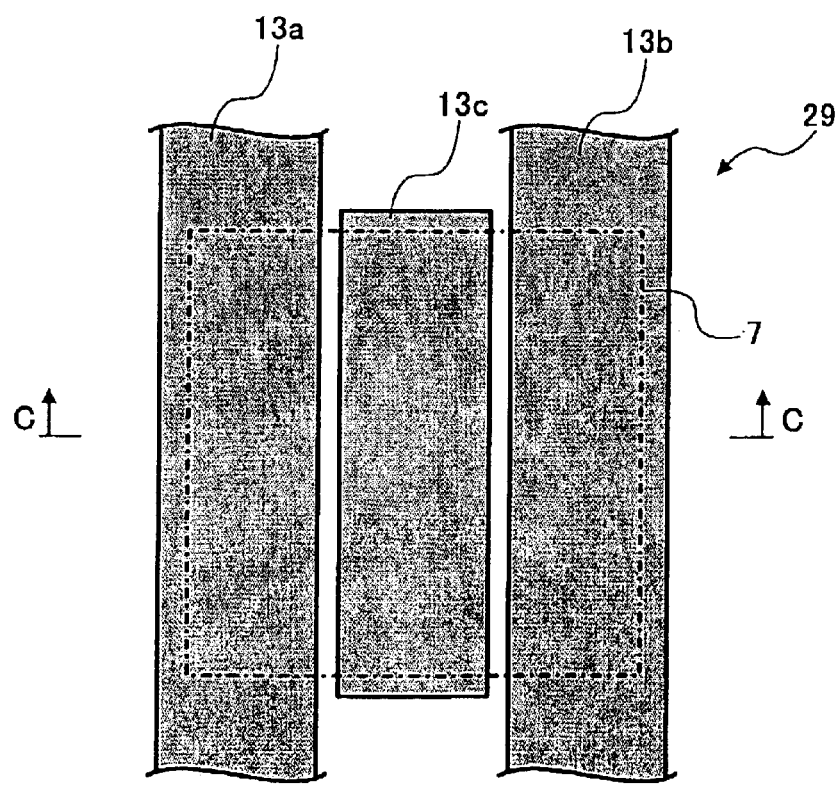
FIG. 8B is a plan view when viewed from a section A—A of FIG. 8A.
Figure 8C:
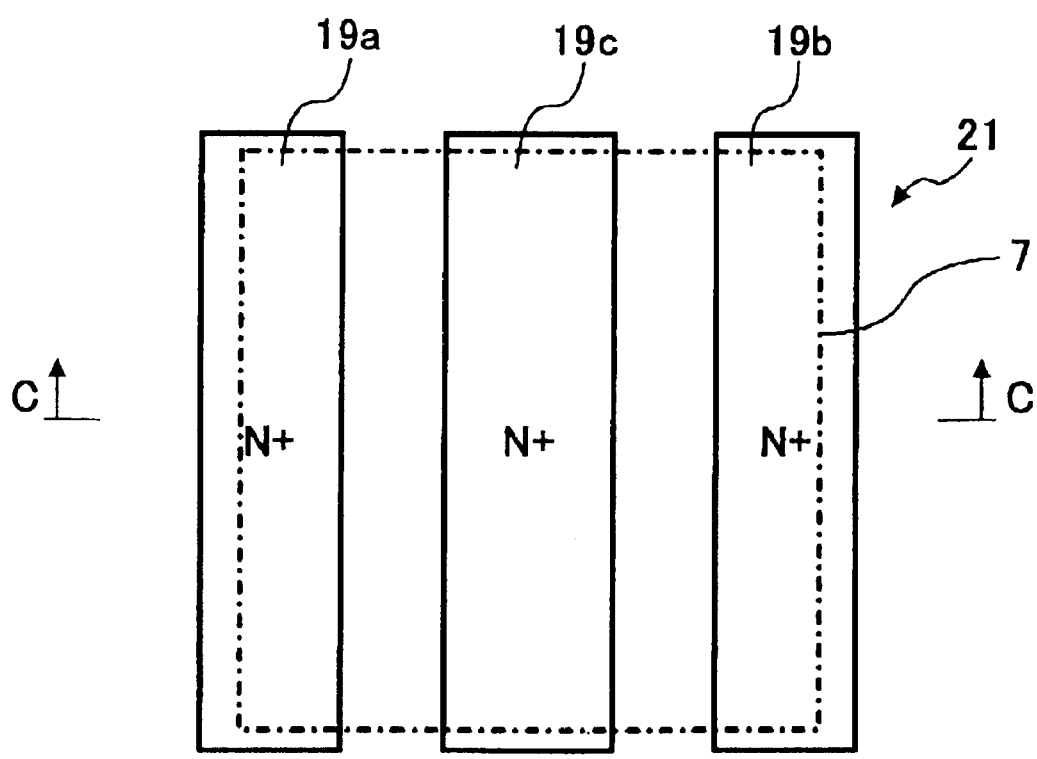
FIG. 8C is a chart when viewed from a section B—B of FIG. 8A.
Figure 10A:
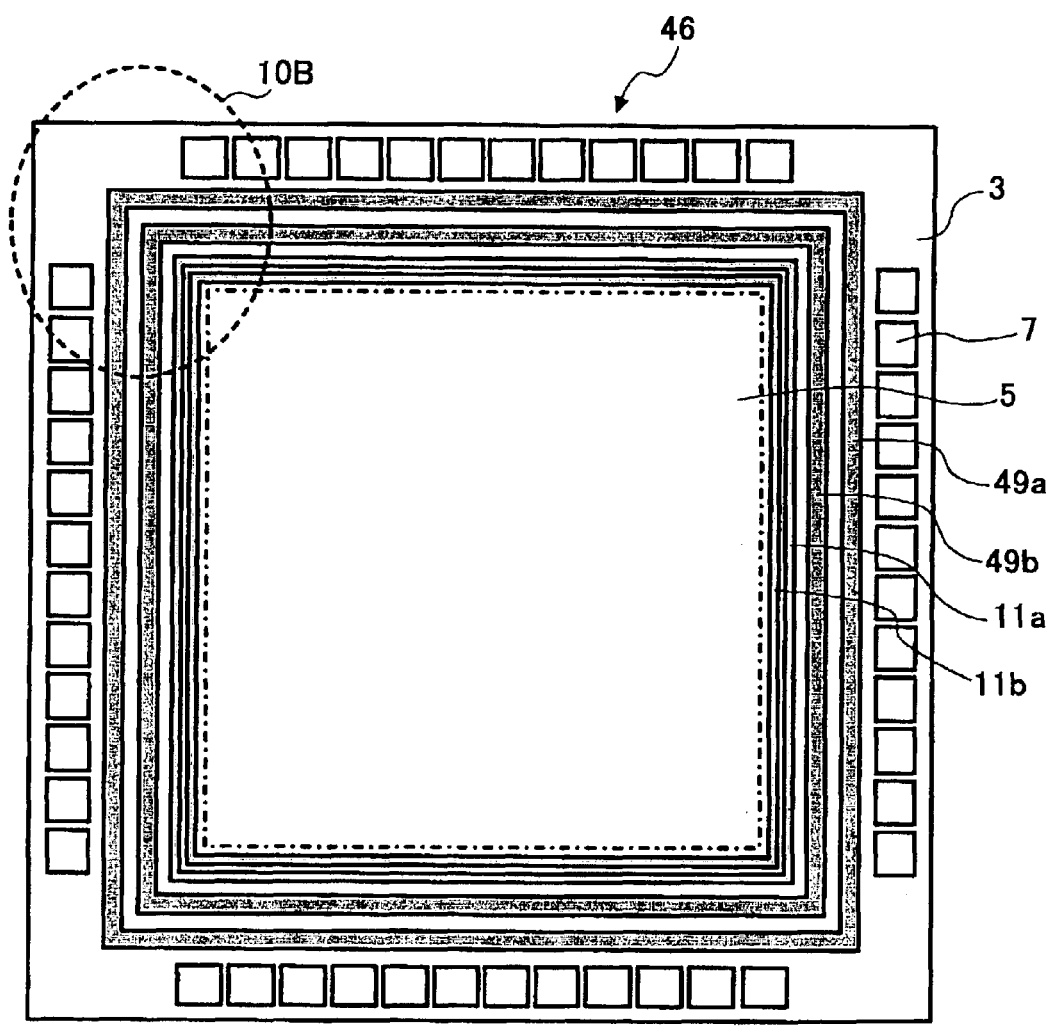
FIG. 10A is a plan view entirely illustrating a conventional semiconductor apparatus.
Figure 10B:
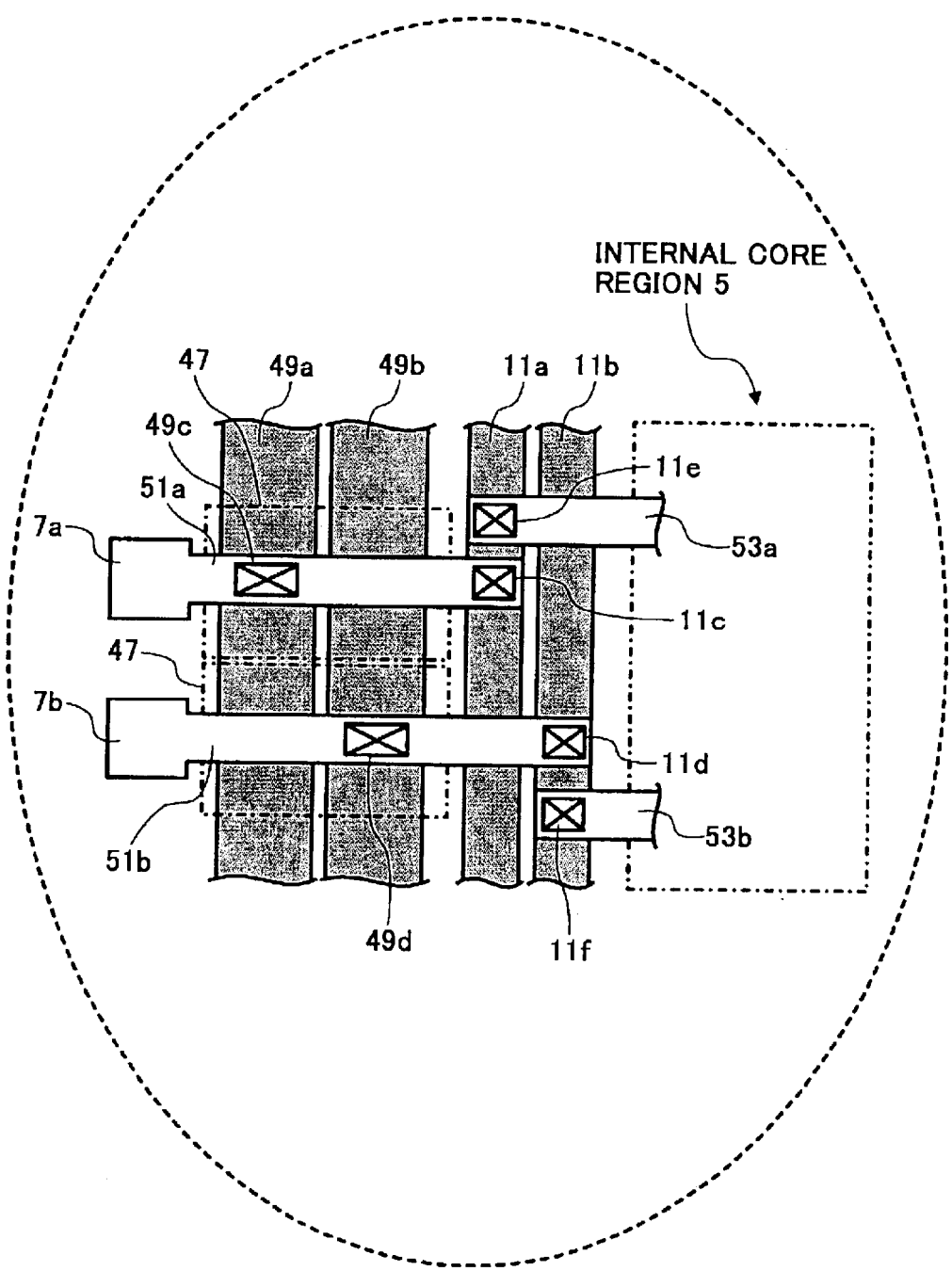
FIG. 10B is an enlarged plan view partially illustrating GND and a pad.
Figure 11:
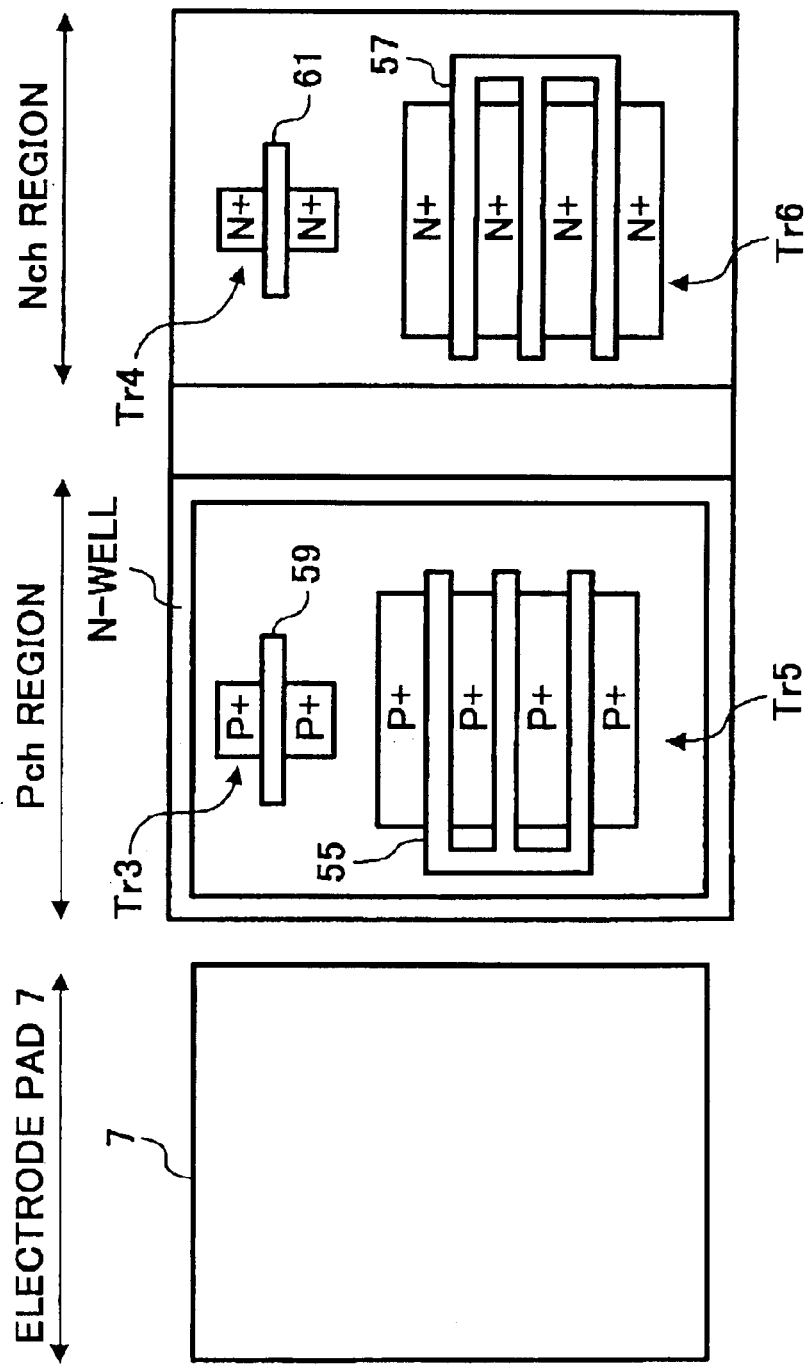
FIG. 11 is a plan view illustrating an example of a pad area 7 and I/O cell 47.
Figure 12:
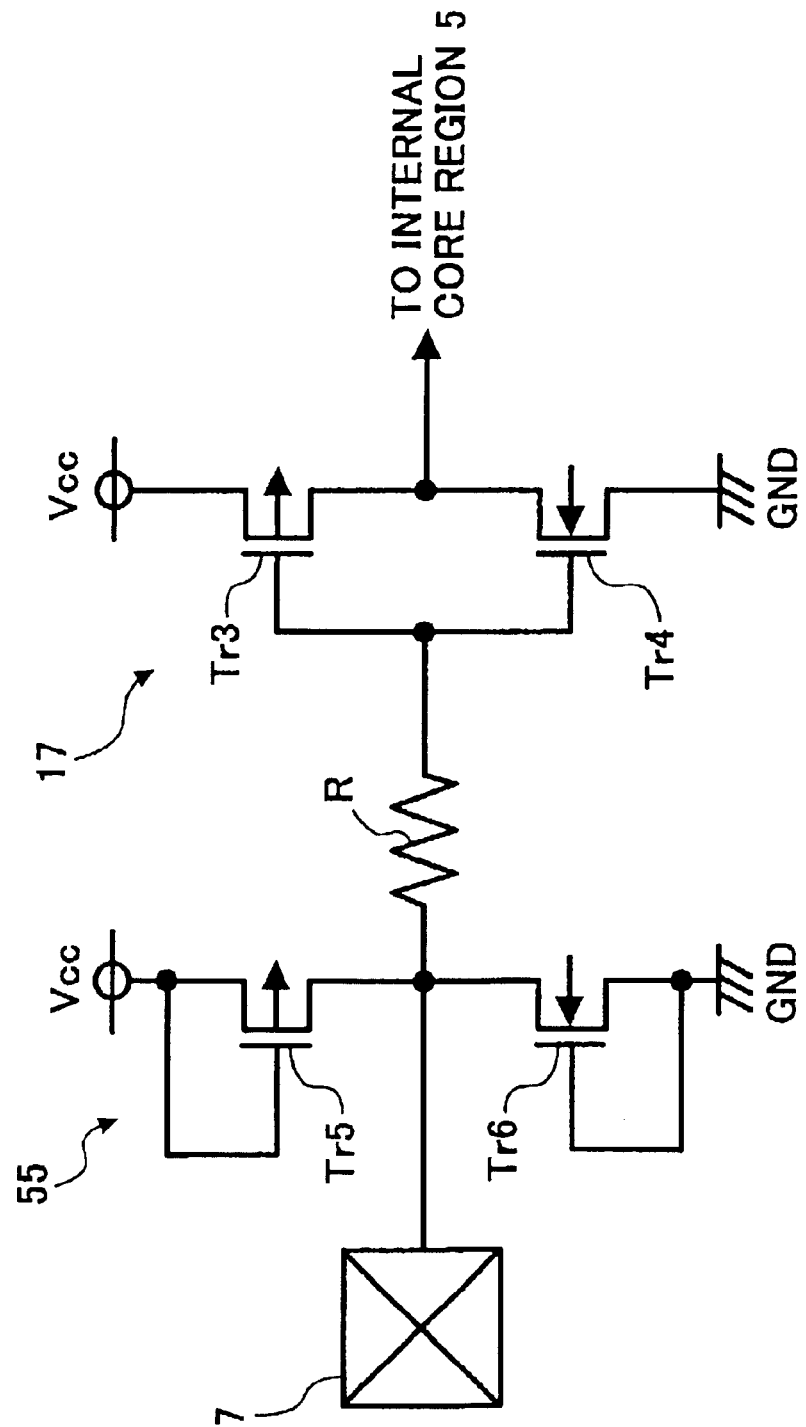
FIG. 12 is a chart illustrating an equivalent circuit of the conventional pad and I/O cell.

FIGS. 8A, 8B and 8C illustrate another embodiment of a protection circuit employing a field transistor as a protection element. The same numeric legends are assigned to portions exerting the same function as that in FIG. 1, and detailed explanation is omitted. FIG. 9 illustrates an equivalent circuit of the I/O cell of this embodiment. The plan view of this embodiment is similar to that of the embodiment of FIG. 3.

Referring to FIG. 8A, the N-type impurity diffusion regions 19a, 19b and 19c are formed on the surface of the P-type semiconductor substrate 3. The field oxide coat 21 separates N-type impurity diffusion regions 19a, 19b and 19c. The N-type impurity diffusion region 19a is formed at a distance from the N-type impurity diffusion region 19c. The N-type impurity diffusion region 19b is formed at a distance opposite the N-type impurity diffusion region 19c, and opposite the N-type impurity diffusion region 19a.

An insulation coat 23 is formed on the surfaces of the N-type impurity diffusion regions 19a, 19b and 19c. The lowest metal wiring layers 45a, 45b, and 45c are separately formed from each other on the insulation coat 23. The lowest metal wiring layers 45a, 45b, and 45c are electrically connected to the N-type impurity diffusion regions 19a, 19b, and 19c, respectively, through via holes formed through the insulation coat 23. The metal wiring layer 45c is not formed on the field oxide coat 21.

An interlaminar insulation layers 27 are formed on a field oxide coat 21, insulation coat 23, and lowest metal wiring layers 45a, 45b, and 45c. Further, I/O cell use Vcc line 13a, I/O cell use GND line 13b, and metal wiring layer 13c are formed on the layers 27. The I/O cell use Vcc line 13a and GND line 13b are continuously formed extending over ranges for forming a plurality of pads 7 as illustrated in FIG. 2. Referring again to FIG. 8A, an interlaminar insulation layer 29 is formed on the interlaminar insulation layer 27, I/O cell use Vcc line 13a, I/O cell use GND line 13b, and metal wiring layer 13c. Further, the pad area 7 and passivation coat 31 are formed right on the layer 29.

When a voltage is excessively input and impressed toward the pad area 7, the voltage is discharged by the power supply Vcc or GND by a punch through current of a field transistor formed either from the P-type semiconductor substrate and N-type impurity diffusion regions 19a and 19c or that from the P-type semiconductor substrate and N-type impurity diffusion regions 19a and 19c.

According to the above-described embodiments shown in FIGS. 1 to 9, respective of the N-type impurity diffusion regions 19c, 19a, and 19b serving as first, second, and third diffusion regions, portions other than the range of the pad area 7 are included. However, the first to third diffusion regions can be entirely formed right under the range of the pad area 7.

Further, respective portions of the N-type impurity diffusion regions 19a to 19c are arranged within the range right under die pad area 7. However, any kind of modifications can be employed as far as a portion or all of the diffusion regions of a protection element of a protection circuit can be arranged right under a pad area 7 and a semiconductor apparatus can be downsized.

Further, I/O cell use Vcc line 13a and I/O cell use GND line 13b serving as power supply lines are formed from metal wiring layers. However, these lines can also be formed from poly-silicon coats made into silicide having a low resistance.

Still further, even though the equivalent circuit of FIG. 3 includes the input buffer 17 for the I/O cell, the protection circuit and semiconductor apparatus thereof are applicable to an I/O cell equipped with an output buffer instead of the input buffer 17.

Further, even though, in at least one embodiment, the protection circuit is formed on a P-type semiconductor substrate, the protection circuit can also be formed in any one of a P-type well, a N-type semiconductor substrate, and a N-type well. When the protection circuit is formed on the N-type semiconductor substrate or N-type well, a diffusion region may be a P-type. Further, the diffusion region is not limited to a singular layer, and can be multiple.

Numerous additional modifications and variations of the present invention are possible in light of the above teachings. Accordingly, the invention is not to be considered as being limited by the foregoing description and drawings, but is only limited by the scope of the appended claims.

What is claimed is:

1. A protection circuit for protecting an inner circuit formed on a semiconductor apparatus, said protection circuit comprising:
   a first conductivity type semiconductor substrate;
   a second conductivity type first diffusion region formed on the semiconductor substrate;
   a second conductivity type second diffusion region formed on the semiconductor substrate, said second diffusion region being distanced at a prescribed interval from the first diffusion region; and
   wherein said first diffusion region is electrically connected to a pad, said pad electrically connecting said inner circuit to an outside region, wherein said second diffusion region is electrically connected to a power supply, and wherein at least a portion of said first and second diffusion regions is formed right under said pad.

2. The protection circuit according to claim 1, wherein said first and second diffusion regions are substantially entirely formed right under said pad.

3. The protection circuit according to claim 2, wherein said first and second diffusion regions are separated from each other by a field oxide coat formed on the surface of the semiconductor substrate, and wherein at least a portion of said field oxide coat is located right under said pad.

4. The protection circuit according to claim 1, further comprising a second conductivity type third diffusion region formed on the surface of the semiconductor substrate, said third diffusion region being located at an opposite side at a prescribed interval from the first diffusion region to the second diffusion region; wherein said second diffusion region is electrically connected to a higher voltage of said power supply, said third diffusion region is electrically connected to a lower voltage of said power supply, and wherein at least a portion of the third diffusion region is formed right under said pad.

5. The protection circuit according to claim 4, wherein said third diffusion region is substantially entirely formed right under said pad.

6. The protection circuit according to claim 4, wherein said first and second diffusion regions, and said first and third diffusion regions are separated, respectively, from each other by a field oxide coat, and wherein at least a portion of said pad is formed on the field oxide coat.

7. The protection circuit according to claim 1, wherein said electrical connection is performed by at least one via hole, said at least one via hole being formed right under said pad.

8. The protection circuit according to claim 1, wherein said protection circuit comprises an I/O cell equipped with an output buffer.

9. The protection circuit according to claim 1, wherein said protection circuit comprises at least one transistor.

10. The protection circuit according to claim 1, wherein at least one insulation layer is formed on the surface of each said diffusion region.

11. A semiconductor apparatus, comprising:
    a plurality of pad areas each including a pad for electrically connecting an inner circuit of a semiconductor apparatus to an outside region; and
    a protection circuit for protecting an inner circuit formed on a semiconductor apparatus, said protection circuit comprising:
    a first conductivity type semiconductor substrate;
    a second conductivity type first diffusion region formed on the semiconductor substrate;
    a second conductivity type second diffusion region formed on the semiconductor substrate, said second diffusion region being distanced at a prescribed interval from the first diffusion region; and
    wherein said first diffusion region is electrically connected to a pad, said pad electrically connecting said inner circuit to an outside region, wherein said second diffusion region is electrically connected to a power supply, and wherein at least a portion of said first and second diffusion regions is formed right under said pad, said protection circuit being formed per pad area.

12. A semiconductor apparatus, comprising:
    a plurality of pad areas each configured to include a pad configured to electrically connect an inner circuit of a semiconductor apparatus to an outside region, said plurality of pad areas being arranged around a core region including said inner circuit;
    a protection circuit for protecting an inner circuit formed on a semiconductor apparatus, said protection circuit comprising:
    a first conductivity type semiconductor substrate;
    a second conductivity type first diffusion region formed on the semiconductor substrate;
    a second conductivity type second diffusion region formed on the semiconductor substrate, said second diffusion region being distanced at a prescribed interval from the first diffusion region; and
    wherein said first diffusion region is electrically connected to a pad, said pad electrically connecting said inner circuit to an outside region, wherein said second diffusion region is electrically connected to a power supply, and wherein at least a portion of said first and second diffusion regions is formed right under said pad; and one of a power supply line and a GND line configured to electrically connect a second diffusion region formed in the protection circuit to one of lower and higher side voltages of the power supply, said one of a power supply line and a GND line being formed on a layer between the pad area and the protection circuit, and said one of a power supply line and a GND line continuously extending over said plurality of pad areas.

13. A semiconductor apparatus, comprising:

a plurality of pad areas configured to include pads and arranged around a core region having an inner circuit, said pads electrically connecting said inner circuit to an outside region;

a protection circuit for protecting an inner circuit formed on a semiconductor apparatus, said protection circuit comprising:
- a first conductivity type semiconductor substrate;
- a second conductivity type first diffusion region formed on the semiconductor substrate;
- a second conductivity type second diffusion region formed on the semiconductor substrate, said second diffusion region being distanced at a prescribed interval from the first diffusion region; and
- wherein said first diffusion region is electrically connected to a pad, said pad electrically connecting said inner circuit to an outside region, wherein said second diffusion region is electrically connected to a power supply, and wherein at least a portion of said first and second diffusion regions is formed right under said pad; and at least one power supply line operative to electrically connect a second diffusion region formed in the protection circuit to a higher voltage of a power supply, said at least one power supply line formed on a layer between said pad area and said protection circuit, said power supply line continuously extending over said plurality of pad areas, and wherein at least one GND line operative to electrically connect a third diffusion region to a lower side voltage of said power supply, said at least one GND line being arranged to continuously extend over said plurality of pad areas.

14. The semiconductor apparatus of claim 12, said inner circuit being formed from a plurality of semiconductor elements formed in said core region.

15. The semiconductor apparatus of claim 12, wherein an I/O cell is configured for each said pad area on said semiconductor substrate.

16. The semiconductor apparatus of claim 15, wherein said I/O cell is equipped with an output buffer.

17. The semiconductor apparatus of claim 12, wherein said power supply line and GND line are formed from any one of metal wiring layers and poly-silicon wiring layers.

18. The semiconductor apparatus of claim 17, further comprising more than five metal wiring layers formed between a semiconductor substrate and pad.

19. The semiconductor apparatus of claim 12, wherein said electrical connection is performed by at least one via hole, said at least one via hole being formed right under said pad area.

20. A method for manufacturing a protection circuit for protecting an inner circuit of a semiconductor apparatus, said method comprising the steps of:

providing a first conductivity type semiconductor substrate;

providing a second conductivity type first diffusion region on said semiconductor substrate;

providing a second conductivity type second diffusion region on said semiconductor substrate at a prescribed interval from the first diffusion region;

electrically connecting said first diffusion region to a pad electrically connecting said inner circuit to an outside region; and electrically connecting said second diffusion region to a power supply; and locating at least a portion of said first and second diffusion regions right under a pad area.

21. The method according to claim 20, wherein an I/O cell is configured for each said pad area on said semiconductor substrate.

22. The method according to claim 20, further comprising the steps of:

providing a field oxide layer on the surface of said semiconductor substrate and said first and second diffusion regions; and locating at least a portion of the field oxide layer right under said pad area.

23. The method according to claim 20, further comprising the steps of:

forming a second conductivity type third diffusion region on the surface of said semiconductor substrate in an opposite side at a prescribed interval from said first diffusion region to said second diffusion region;

electrically connecting said second diffusion region to a higher voltage of said power supply;

electrically connecting said third diffusion region to a lower voltage of the power supply; and forming at least a portion of said third diffusion region right under said pad area.

24. The method according to claim 22, wherein at least one interlaminar insulation layer is formed on said field oxide layer.

25. The method according to claim 24, wherein at least one passivation layer is formed on said insulation layer.

26. The protection circuit according to claim 1, wherein said first diffusion region and said second diffusion region collectively form a field transistor.

* * * * *